United States Patent
Hsieh et al.

(10) Patent No.: US 12,557,563 B2
(45) Date of Patent: Feb. 17, 2026

(54) LAYER STACKS FOR A RESISTIVE MEMORY ELEMENT

(71) Applicant: GlobalFoundries Singapore Pte. Ltd., Singapore (SG)

(72) Inventors: Curtis Chun-I Hsieh, Singapore (SG); Kai Kang, Singapore (SG); Wanbing Yi, Singapore (SG); Yongshun Sun, Singapore (SG); Eng-Huat Toh, Singapore (SG); Juan Boon Tan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 430 days.

(21) Appl. No.: 18/105,922

(22) Filed: Feb. 6, 2023

(65) Prior Publication Data
US 2024/0268241 A1    Aug. 8, 2024

(51) Int. Cl.
*H10N 70/00*  (2023.01)
*H01L 23/528*  (2006.01)
*H10B 63/00*  (2023.01)

(52) U.S. Cl.
CPC ....... *H10N 70/841* (2023.02); *H01L 23/5283* (2013.01); *H10B 63/30* (2023.02); *H10B 63/34* (2023.02); *H10N 70/063* (2023.02); *H10N 70/883* (2023.02)

(58) Field of Classification Search
CPC ......... H10N 70/24–245; H10N 70/826; H10N 70/8416
See application file for complete search history.

(56) References Cited

U.S. PATENT DOCUMENTS

| | | | |
|---|---|---|---|
| 8,470,637 | B2 | 6/2013 | Tseng et al. |
| 8,842,462 | B2 | 9/2014 | Liu et al. |
| 9,385,316 | B2 | 7/2016 | Liao et al. |
| 2011/0096595 | A1 | 4/2011 | Terai |
| 2012/0025163 | A1 | 2/2012 | Onishi et al. |
| 2012/0292588 | A1* | 11/2012 | Fujii ............... H10N 70/826 257/E47.001 |
| 2021/0104666 | A1* | 4/2021 | Fu .................. H10B 63/80 |
| 2021/0151674 | A1* | 5/2021 | Pesic ............... G11C 11/5685 |
| 2021/0343937 | A1 | 11/2021 | Peng et al. |

(Continued)

OTHER PUBLICATIONS

European Patent Office; Communication pursuant to Article 94(3) EPC issued in European Patent Application No. 23189672.1 on Sep. 26, 2024; 8 pages.
Rahaman, Dr. S. Z. et al., "The Role of Ti Buffer Layer Thickness on the Resistive Switching Properties of Hafnium Oxide Based Resistive Switching Memories." Langmuir. vol. 33, No. 19. DOI:10.1021/acs.langmuir.7b00479; pp. 4654-4665. (Apr. 18, 2017).
Beckmann, K. et al., "The effect of reactive ion etch (RIE) process conditions on ReRAM device performance." Semiconductor Science and Technology, vol. 32, Issue 9, 9 paged; article id. 095013; DOI: 10.1088/1361-6641/aa7eed (Sep. 2017).

(Continued)

*Primary Examiner* — Kevin Parendo
(74) *Attorney, Agent, or Firm* — Thompson Hine LLP

(57) ABSTRACT

Structures that include a layer stack for a resistive memory element and methods of forming a structure that includes a layer stack for a resistive memory element. The structure comprises a resistive memory element including a first electrode, a second electrode, and a switching layer disposed between the second electrode and the first electrode. The first electrode includes a first layer and a second layer between the first layer and the switching layer. The switching layer has a first thickness, and the second layer of the first electrode has a second thickness that is less than the first thickness of the switching layer.

16 Claims, 3 Drawing Sheets

(56) References Cited

U.S. PATENT DOCUMENTS

2022/0223788 A1* 7/2022 Cheng .................. H10N 70/011
2022/0310915 A1   9/2022 Loy et al.

OTHER PUBLICATIONS

European Patent Office, Extended European Search Report and Opinion issued in European Patent Application No. 23189672.1 on Jan. 17, 2024; 14 pages.

European Patent Office; Communication under Rule 71(3) EPC issued in European Patent Application No. 23189672.1 on May 7, 2025; 9 pages.

B. Traoré et al., "HfO2-Based RRAM: Electrode Effects, Ti/HfO2 Interface, Charge Injection, and Oxygen (O) Defects Diffusion Through Experiment and Ab Initio Calculations," in IEEE Transactions on Electron Devices, vol. 63, No. 1, pp. 360-368, Jan. 2016, doi: 10.1109/TED.2015.2503145.

H. Y. Lee et al., "Low power and high speed bipolar switching with a thin reactive Ti buffer layer in robust HfO2 based RRAM," 2008 IEEE International Electron Devices Meeting, San Francisco, CA, USA, 2008, pp. 1-4, doi: 10.1109/IEDM.2008.4796677.

G. Piccolboni et al., "Investigation of HfO2/Ti based vertical RRAM - Performances and variability," 2014 14th Annual Non-Volatile Memory Technology Symposium (NVMTS), Jeju, Korea (South), 2014, pp. 1-5, doi: 10.1109/NVMTS.2014.7060867.

* cited by examiner

LAYER STACKS FOR A RESISTIVE MEMORY ELEMENT

BACKGROUND

This disclosure relates to integrated circuits and semiconductor device fabrication and, more specifically, to structures that include a layer stack for a resistive memory element and methods of forming a structure that includes a layer stack for a resistive memory element.

A resistive random-access memory device provides one category of embedded non-volatile memory technology. A bitcell of a resistive random-access memory device typically includes a resistive memory element and an access transistor that controls operations used to write, erase, and read the resistive memory element. Because resistive memory elements are non-volatile, bits of data are retained as stored content by the resistive memory elements when the resistive random-access memory device is unpowered. The non-volatility of a resistive random-access memory device contrasts with volatile memory technologies, such as a static random-access memory device in which the stored content is eventually lost when unpowered and a dynamic random-access memory device in which the stored content is lost unless periodically refreshed.

A resistive memory element includes a switching layer that is positioned in a layer stack between a bottom electrode and a top electrode. The resistive memory element can be programmed by changing the resistance across the switching layer to provide different content-storage conditions, namely a high-resistance state and a low-resistance state, representing the stored bits of data. The switching layer can be modified by applying a programming voltage across the bottom and top electrodes that is sufficient to create one or more conductive filaments bridging across the thickness of the switching layer, which sets the low-resistance state. The conductive filaments can be destroyed, also by the application of a programming voltage, to reset the resistive memory element to the high-resistance state. The content-storage condition can be read by measuring a voltage drop across the resistive memory element after it has been programmed.

Improved structures including a layer stack for a resistive memory element and methods of forming a structure that includes a layer stack for a resistive memory element are needed.

SUMMARY

According to an embodiment of the invention, a structure for a random-access resistive memory device is provided. The structure comprises a resistive memory element including a first electrode, a second electrode, and a switching layer disposed between the second electrode and the first electrode. The first electrode includes a first layer and a second layer between the first layer and the switching layer. The switching layer has a first thickness, and the second layer of the first electrode has a second thickness that is less than the first thickness of the switching layer.

According to another embodiment of the invention, a method of forming a structure for a random-access resistive memory device is provided. The method comprises forming a resistive memory element including a first electrode, a second electrode, and a switching layer between the second electrode and the first electrode. The first electrode includes a first layer and a second layer disposed between the first layer and the switching layer. The switching layer has a first thickness, and the second layer of the first electrode has a second thickness that is less than the first thickness of the switching layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
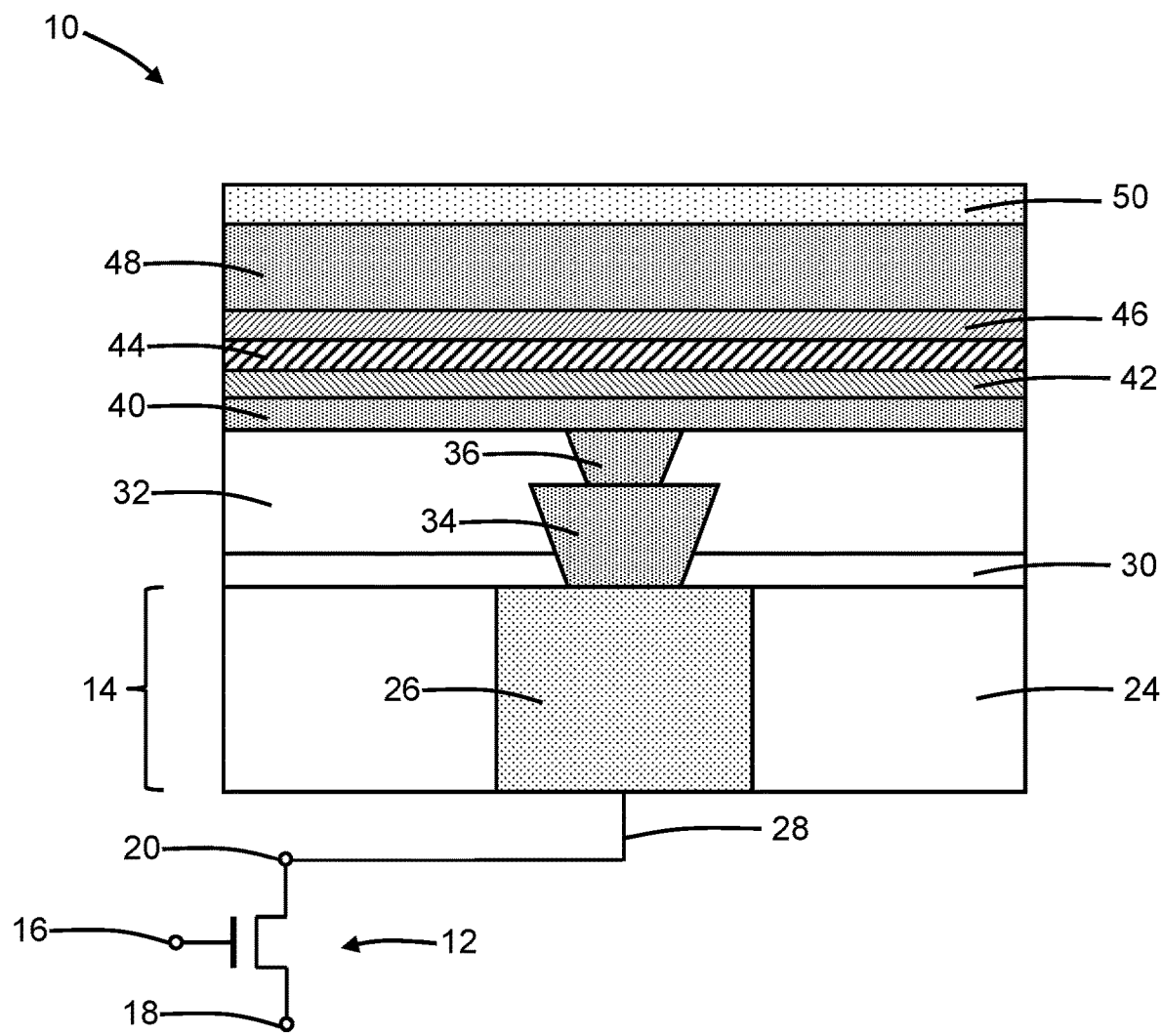
FIGS. 1-3 are cross-sectional views of a bitcell structure at successive fabrication stages of a processing method in accordance with embodiments of the invention.

With reference to FIG. 1 and in accordance with embodiments of the invention, a bitcell 10 for a resistive random access memory device includes a transistor 12 that controls access to a subsequently-formed non-volatile memory element and a metallization level 14 of an interconnect structure over the transistor 12. The transistor 12 may include a gate electrode 16, a source 18, and a drain 20, and the transistor 12 may be formed by front-end-of-line processing of a substrate, such as a silicon-on-insulator substrate or a bulk semiconductor substrate. The gate electrode 16 may be comprised of a conductor, such as doped polycrystalline silicon (i.e., polysilicon) or one or more work-function metals, and a gate dielectric comprised of an electrical insulator, such as silicon dioxide or a high-k dielectric material. The source 18 and drain 20 may be comprised of a doped semiconductor material, such as doped silicon or doped silicon-germanium. The transistor 12 may be, for example, an n-type planar field-effect transistor, an n-type fin-type field-effect transistor, or an n-type gate-all-around field-effect transistor.

The metallization level 14 may be fabricated by back-end-of-line processing as a wiring layer of the interconnect structure. The metallization level 14 may include an interlayer dielectric layer 24 and a metal feature 26 disposed in the interlayer dielectric layer 24. The interlayer dielectric layer 24 may be comprised of a dielectric material, such as silicon dioxide or a low-k dielectric material, that is an electrical insulator, and the metal feature 26 may be comprised of a metal, such as copper. The interconnect structure may include additional metallization levels (not shown) between the transistor 12 and the metallization level 14, and the drain 20 of the transistor 12 may be coupled to the metal feature 26 by an interconnection 28 formed in the additional metallization levels. The interconnection 28 to the metal feature 26 may include metal islands, vias, and/or contacts arranged in the interlayer dielectric layers of the additional metallization levels.

Dielectric layers 30, 32 may be formed over the metallization level 14, and stacked metal features 34, 36 may be formed as vias in the dielectric layers 30, 32. The dielectric layer 30 may be comprised of a dielectric material, such as silicon-carbon nitride or hydrogenated silicon-carbon nitride, that is an electrical insulator, and the dielectric layer 32 may be comprised of a dielectric material, such as silicon dioxide, that is an electrical insulator. The silicon dioxide comprising the dielectric layer 32 may be formed by plasma-enhanced chemical vapor deposition using ozone and tetraethylorthosilicate as reactants. The metal features 34, 36 may be comprised of a metal, such as tantalum nitride, and the metal features 34, 36 may be formed by deposition and planarization in respective openings that are patterned in the dielectric layers 30, 32.

Multiple layers 40, 42, 44, 46, 48, 50 may be formed in a layer stack over, and on, the dielectric layers 30, 32. The layers 40, 42, 44, 46, 48, 50 overlap with the underlying metal features 34, 36. The layer 40 may be comprised of a metal, such as tantalum nitride, and the layer 40 may have a thickness of about 7 nanometers. The layer 42 may be comprised of a metal capable of gettering a reactive species, such as oxygen, that may be present in, or introduced into, the layer stack. In an embodiment, the layer 42 may be comprised of titanium, and the layer 42 may have a thickness in a range of about 3 nanometers to about 5 nanometers. In an embodiment, the thickness of layer 42 may be about 3 nanometers. The layer 44 may be comprised of a material capable of functioning as a switching layer in the completed device. In an embodiment, the layer 44 may be comprised of a metal oxide, such as hafnium oxide. In an embodiment, the thickness of the layer 42 may be less than the thickness of the layer 44. The layer 46 may be comprised of a noble metal, such as platinum, and the layer 46 may have a thickness of about 10 nanometers. The layer 48 may be comprised of a metal, such as tantalum nitride, that is capable of reacting with oxygen, and the layer 48 may have a thickness that is greater than or equal to 60 nanometers. The layer 50 may be comprised of a dielectric material, such as silicon nitride.

Figure 2:
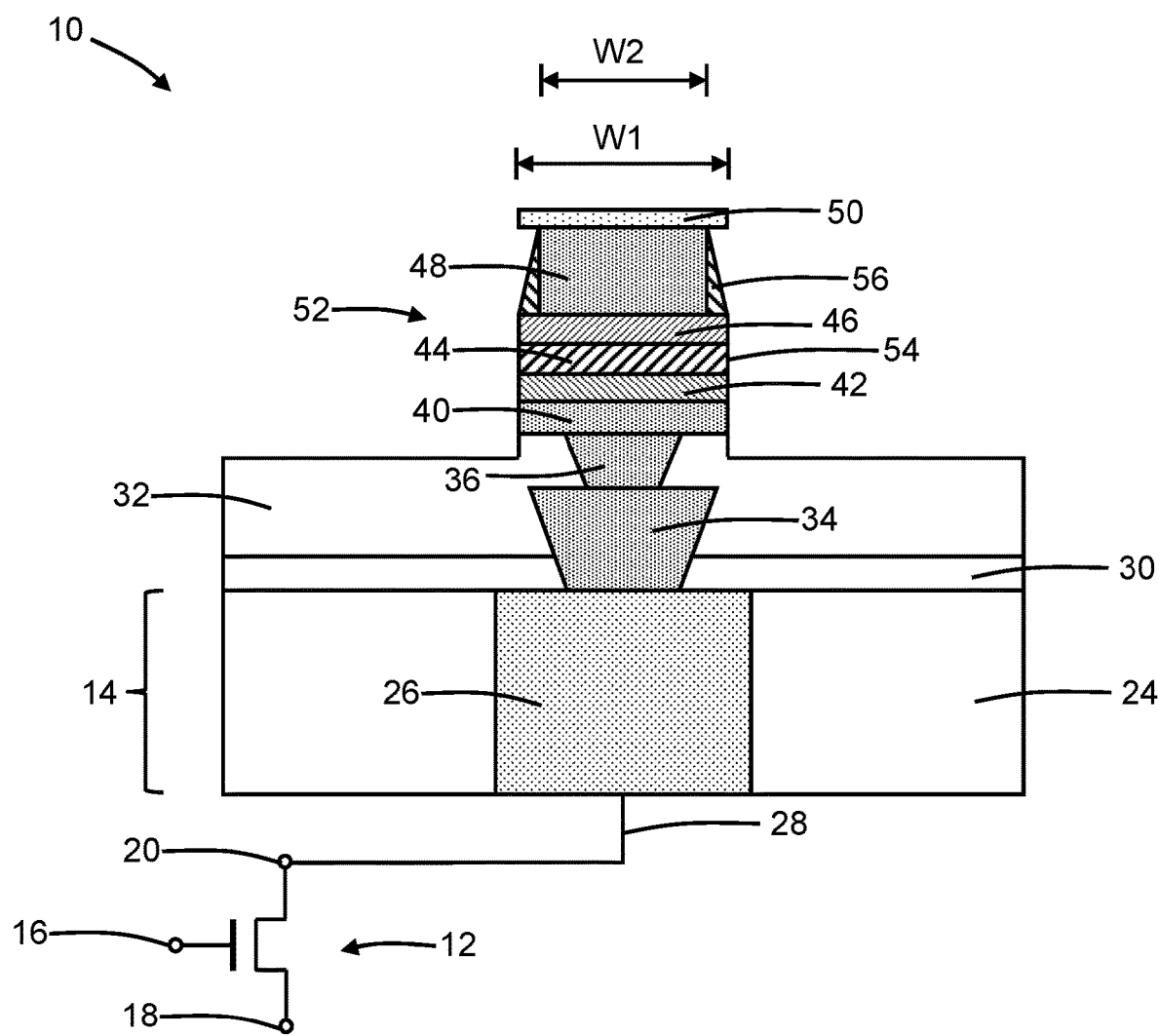

With reference to FIG. 2 in which like reference numerals refer to like features in FIG. 1 and at a subsequent fabrication stage, the layers 40, 42, 44, 46, 48, 50 of the layer stack are patterned by lithography and etching processes to form a non-volatile memory element 52. The layer 50 may be initially patterned to define a hardmask that is subsequently used to pattern the underlying layers 40, 42, 44, 46, 48. The etching process used to pattern the layers 40, 42, 44, 46, 48 may be a reactive ion etching process that relies on a gas mixture containing argon and oxygen. In an embodiment, the ratio of argon to oxygen in the gas mixture may range from 12:0.8 to 12:1.2. The dielectric layer 32 may function as an etch stop during the reactive ion etching process.

The etched layers 40, 42, 44, 46 may share sidewalls 54 and may have a width W1 between opposite sidewalls 54. The etched layer 48 may have a width W2 that is less than the width W1, and spacers 56 may be formed at the periphery of the etched layer 46. The etched layer 48 is disposed on an inner portion of the etched layer 46, and the spacers 56 are disposed on outer portions of the etched layer 46. In an embodiment, the etched layer 48 and the spacers 56 may fully cover a top surface of the etched layer 46 that is opposite to the interface between the etched layer 46 and the etched layer 44. In an embodiment, the spacers 56 may be comprised of a metal oxynitride, such as tantalum oxynitride. In an embodiment, the spacers 56 may be formed by the oxidation of peripheral portions of the metal of the layer 48 during the reactive ion etching process patterning the layer stack. The ratio of argon to oxygen in the gas mixture may contribute to minimizing etch damage while also forming the spacers 56. Although not shown, peripheral portions of the etched layer 40 may also be oxidized during the reactive etching process.

The etched layer 40 may be disposed adjacent to the metal feature 36. The metal feature 36, which may be trapezoidal in shape, may have a width is less than the width W1 and that increases with decreasing distance from the etched layer 40.

The metal feature 36 may be disposed beneath a central portion of the etched layer 40, and portions of the dielectric layer 32 may be disposed beneath outer portions of the etched layer 40. The dielectric layer 32 may be recessed adjacent to the sidewalls 54 of the etched layers 40, 42, 44, 46. In an alternative embodiment, the sidewalls 54 and the spacers 56 may be curved with respective convex curvatures.

The etched layer 46 and the etched layer 48 may collectively define a top electrode of the non-volatile memory element 52. The etched layer 40 and the etched layer 42 may collectively define a bottom electrode of the non-volatile memory element 52. The etched layer 40 of the bottom electrode is electrically and physically connected to the metal feature 36. The etched layer 44 may define a switching layer that is disposed in a vertical direction between the top electrode and the bottom electrode. The etched layer 42 of the bottom electrode is disposed between the etched layer 40 of the bottom electrode and the switching layer defined by the etched layer 44. The etched layer 46 of the top electrode is disposed between the etched layer 48 of the top electrode and the switching layer defined by the etched layer 44. In an embodiment, the etched layer 40 of the bottom electrode may adjoin the metal feature 36, and the etched layer 42 of the bottom electrode may adjoin the switching layer defined by the etched layer 44. In an embodiment, the etched layer 46 of the top electrode may adjoin the switching layer defined by the etched layer 44.

Figure 3:
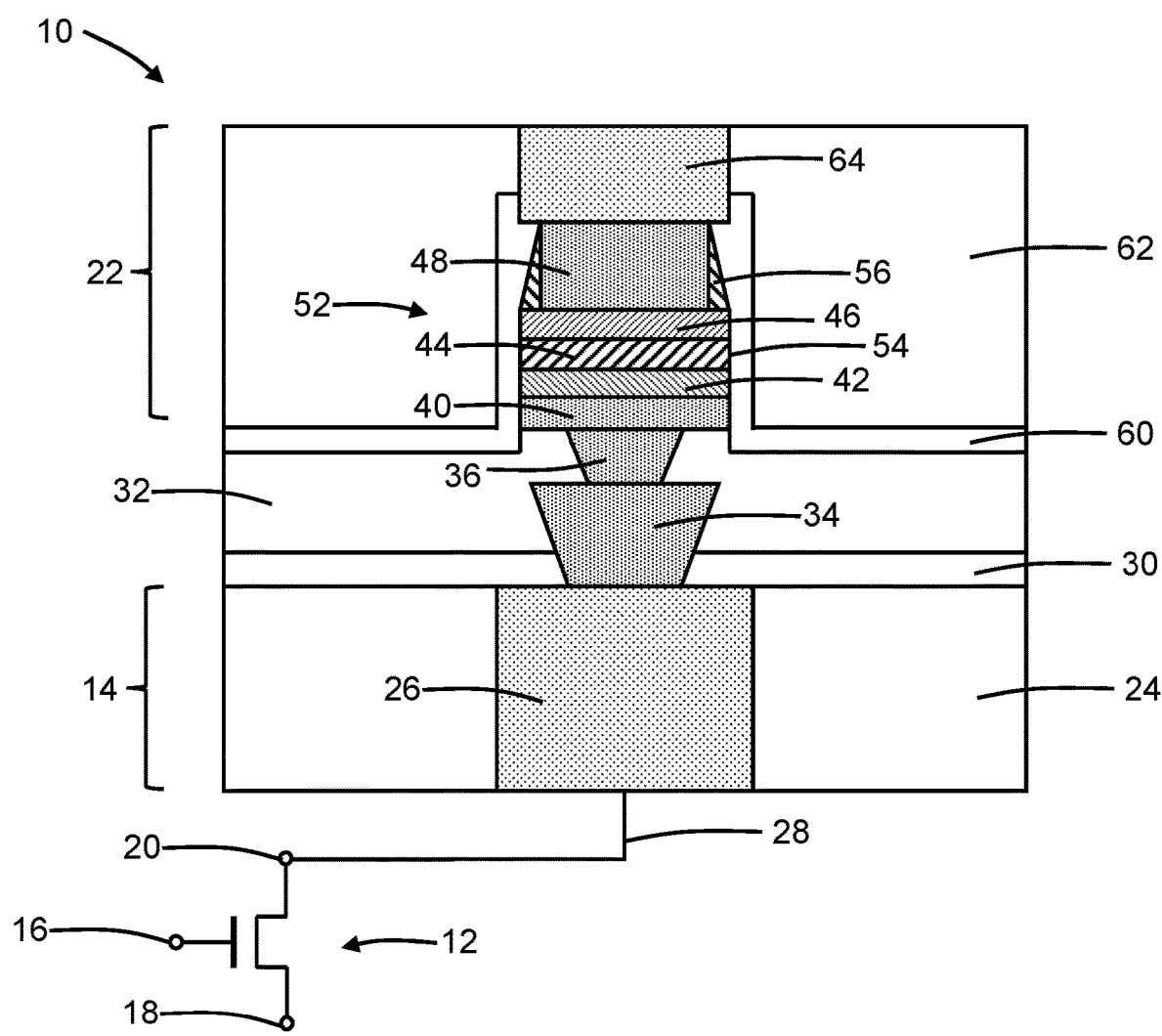

With reference to FIG. 3 in which like reference numerals refer to like features in FIG. 2 and at a subsequent fabrication stage, dielectric layers 60, 62 of a metallization level 22 may be formed over the non-volatile memory element 52, and a metal feature 64 may be formed in the dielectric layers 60, 62. The dielectric layer 60 may be comprised of a dielectric material, such as silicon nitride, that is an electrical insulator, and the dielectric layer 60 may define a conformal capping layer that extends across the non-volatile memory element 52. The dielectric layer 62 may be comprised of a dielectric material, such as silicon dioxide or a low-k dielectric material, that is an electrical insulator, and the metal feature 64 may be comprised of a metal, such as copper. The metal feature 64 may be physically and electrically connected to the etched layer 48 of the top electrode of the non-volatile memory element 52. In an embodiment, the metal feature 64 may adjoin the etched layer 48 of the top electrode.

The gas mixture of argon and oxygen used to perform the reactive etching process patterning the non-volatile memory element 52 may prevent or reduce etch damage in comparison with other gas mixtures, such as a gas mixture of chlorine and fluorine, used in conventional reactive ion etching processes for the same purpose. The spacers 56 are concurrently formed during the reactive ion etching process patterning the layer stack, instead of being formed before the reactive ion etching process. The etched layer 42, which is included in the bottom electrode and disposed immediately below the switching layer, may operate to prevent or reduce the occurrence of open bitcells.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a random-access resistive memory device, the structure comprising:
   a resistive memory element including a first electrode, a second electrode, and a switching layer disposed between the second electrode and the first electrode, the first electrode including a first layer and a second layer between the first layer and the switching layer, the second electrode including a first layer and a second layer between the first layer and the switching layer, the first layer of the second electrode disposed on an inner portion of the second layer of the second electrode, the switching layer having a first thickness, and the second layer of the first electrode having a second thickness that is less than the first thickness of the switching layer; and
   a plurality of spacers disposed on respective outer portions of the second layer of the second electrode at the periphery of the first layer of the second electrode,
   wherein the first layer of the second electrode comprises tantalum nitride, and the plurality of spacers comprise tantalum oxynitride.

2. The structure of claim 1 further comprising:
   an interconnect structure including a dielectric layer and a metal feature in the dielectric layer,
   wherein the first electrode is disposed on the metal feature.

3. The structure of claim 2 wherein the dielectric layer comprises silicon dioxide, and the metal feature comprises tantalum nitride.

4. The structure of claim 3 wherein the first layer of the first electrode comprises tantalum nitride.

5. The structure of claim 2 wherein the first layer of the first electrode adjoins the metal feature, and the second layer of the first electrode adjoins the switching layer.

6. The structure of claim 2 wherein the metal feature has a trapezoidal shape with a first width that increases with decreasing distance from the first layer of the first electrode, and the first layer of the first electrode has a second width that is greater than the first width.

7. The structure of claim 1 wherein the first layer of the first electrode comprises a first material, and the second layer of the first electrode comprises a second material with a different composition from the first material.

8. The structure of claim 7 wherein the first material is tantalum nitride, and the second material is titanium.

9. The structure of claim 1 further comprising:
   a field-effect transistor including a drain coupled to the first layer of the first electrode.

10. The structure of claim 1 further comprising:
    a capping layer extending across the resistive memory element, the capping layer comprising silicon nitride.

11. The structure of claim 1 wherein the first layer of the second electrode comprises tantalum nitride, and the second layer of the second electrode comprises platinum.

12. The structure of claim 1 wherein the second thickness of the second layer of the first electrode is in a range of about 3 nanometers to about 5 nanometers.

13. A method of forming a structure for a random-access resistive memory device, the method comprising:
    forming a resistive memory element including a first electrode, a second electrode, and a switching layer disposed between the second electrode and the first electrode, wherein the first electrode includes a first layer and a second layer between the first layer and the switching layer, the second electrode includes a first layer and a second layer between the first layer and the switching layer, the first layer of the second electrode is disposed on an inner portion of the second layer of the second electrode, the switching layer has a first thickness, and the second layer of the first electrode has a second thickness that is less than the first thickness of the switching layer; and
    forming a plurality of spacers disposed on respective outer portions of the second layer of the second electrode at the periphery of the first layer of the second electrode,
    wherein the first layer of the second electrode comprises tantalum nitride, and the plurality of spacers comprise tantalum oxynitride.

14. The method of claim 13 wherein forming the resistive memory element including the first electrode, the second electrode, and the switching layer between the second electrode and the first electrode comprises:

depositing a layer stack including the first layer; and patterning the first layer with a reactive ion etching process to form a portion of the second electrode and the plurality of spacers adjacent to the portion of the second electrode.

15. The method of claim 14 wherein the reactive ion etching process is performed using a gas mixture that contains argon and oxygen.

16. The method of claim 15 wherein a ratio of argon to oxygen in the gas mixture ranges from 12:0.8 to 12:1.2.

* * * * *